US009606010B2

(12) United States Patent
Kaiser et al.

(10) Patent No.: US 9,606,010 B2
(45) Date of Patent: Mar. 28, 2017

(54) DEVICE FOR MEASURING A PRESSURE AND A TEMPERATURE OF A FLUID MEDIUM FLOWING IN A DUCT

(71) Applicant: ROBERT BOSCH GMBH, Stuttgart (DE)

(72) Inventors: Ralf Kaiser, Althuette (DE); Alexander Lux, Ostfildern (DE); Markus Reinhard, Kornwestheim (DE); Christoph Gmelin, Stuttgart (DE); Reinhold Herrmann, Stuttgart (DE); Patrick Patzner, Leonberg-Silberberg (DE)

(73) Assignee: ROBERT BOSCH GMBH, Stuttgart (DE)

( * ) Notice: Subject to any disclaimer, the term of this patent is extended or adjusted under 35 U.S.C. 154(b) by 453 days.

(21) Appl. No.: 14/280,027

(22) Filed: May 16, 2014

(65) Prior Publication Data
US 2014/0341255 A1    Nov. 20, 2014

(30) Foreign Application Priority Data

May 16, 2013    (DE) .................. 10 2013 209 060

(51) Int. Cl.
*G01K 1/00* (2006.01)
*G01K 13/02* (2006.01)
(Continued)

(52) U.S. Cl.
CPC .............. *G01K 13/02* (2013.01); *G01L 11/00* (2013.01); *G01L 19/0084* (2013.01);
(Continued)

(58) Field of Classification Search
USPC .................. 374/208, 143, 148, 178
See application file for complete search history.

(56) References Cited

U.S. PATENT DOCUMENTS 5,070,706 A * 12/1991 Waters .................... F17C 13/02
374/143
6,813,952 B2 * 11/2004 Yamashita ............... G01K 7/18
374/201
(Continued)

FOREIGN PATENT DOCUMENTS

DE          19731420          1/1999
DE          69817497          6/2004
(Continued)

*Primary Examiner* — Mirellys Jagan
(74) *Attorney, Agent, or Firm* — Norton Rose Fulbright US LLP

(57) ABSTRACT

A device for measuring a pressure and a temperature of a fluid medium flowing in a duct, the device including a pressure sensor element; a temperature sensor having a temperature sensor element; a housing that has a connecting piece, the connecting piece being insertable into the duct in an insertion direction, the connecting piece having an interior chamber, the interior chamber having an opening through which the interior chamber may be exposed to the fluid medium; and a carrier substrate, the pressure sensor element being connected electrically and mechanically to the carrier substrate. In order to increase the service life of the temperature sensor, and in order to allow temperature measurement that is as accurate as possible, it is provided, in this context, that the carrier substrate be positioned substantially parallel to the insertion direction in the interior chamber of the connecting piece, the interior chamber extending along the insertion direction, and it is provided that the temperature sensor be connected electrically and mechanically to the carrier substrate.

12 Claims, 6 Drawing Sheets

(51) Int. Cl.
  *G01L 11/00* (2006.01)
  *G01L 19/00* (2006.01)
  *G01L 19/06* (2006.01)
  *G01L 19/14* (2006.01)
  *G01L 23/24* (2006.01)

(52) U.S. Cl.
  CPC ...... *G01L 19/0092* (2013.01); *G01L 19/0627* (2013.01); *G01L 19/143* (2013.01); *G01L 23/24* (2013.01); *G01K 2205/02* (2013.01)

(56) References Cited

U.S. PATENT DOCUMENTS

| | | | |
|---|---|---|---|
| 7,043,993 | B2 | 5/2006 | Hayashi et al. |
| 7,467,991 | B2 * | 12/2008 | McCowen ............. B24D 15/08 451/347 |
| 7,690,262 | B2 * | 4/2010 | Nakabayashi ........... G01K 1/18 73/708 |
| 7,766,547 | B2 * | 8/2010 | Weppenaar .......... G01D 11/245 374/141 |
| 2004/0101031 | A1 * | 5/2004 | Kotwicki ................ G01K 1/16 374/185 |
| 2007/0121701 | A1 * | 5/2007 | Gennissen ............. G01K 13/02 374/143 |
| 2007/0237205 | A1 * | 10/2007 | Hayashi ................... G01K 1/18 374/163 |
| 2008/0216580 | A1 * | 9/2008 | Kuznia ................... G01L 23/24 73/714 |
| 2009/0095059 | A1 | 4/2009 | Matsui et al. |
| 2009/0323760 | A1 * | 12/2009 | Gebauer ................ G01D 11/24 374/143 |
| 2011/0211614 | A1 * | 9/2011 | Gmelin ................... G01K 1/14 374/208 |
| 2011/0308320 | A1 | 12/2011 | Rocznik |
| 2013/0047736 | A1 * | 2/2013 | Papadeas ............ G01L 19/0038 73/714 |
| 2015/0103863 | A1 * | 4/2015 | Herman ............... G01K 13/028 374/138 |

FOREIGN PATENT DOCUMENTS

| | | |
|---|---|---|
| DE | 60018611 | 1/2006 |
| DE | 102006033467 | 1/2008 |
| DE | 102007032745 | 1/2009 |
| DE | 102010043083 | 5/2012 |
| DE | 102011081923 | 2/2013 |
| EP | 809966 | 12/1997 |
| EP | 1980830 | 10/2008 |

* cited by examiner

DEVICE FOR MEASURING A PRESSURE AND A TEMPERATURE OF A FLUID MEDIUM FLOWING IN A DUCT

FIELD OF THE INVENTION

The present invention relates to a device for measuring a pressure and a temperature of a fluid medium flowing in a duct, for example, in the induction pipe of an internal combustion engine.

BACKGROUND INFORMATION

A device for measuring a pressure and a temperature in the induction pipe of an internal combustion engine is known from German Published Patent Appln. No. 197 31 420. This device has a connecting piece insertable into the induction pipe. A temperature sensor used for measuring the temperature is inserted into this connecting piece. The temperature sensor is made up of a temperature sensor element and of lead wires, which are guided into the interior of the device, and there, electrically contacted and mechanically held.

In operation, such devices are subjected to a variety of thermal and mechanical loads. The temperature sensor has a temperature sensor element, which is attached to a conducting wire and is exposed to a flow of a fluid medium in the induction pipe. At an end of the device facing away from the fluid medium, the conducting wire is contacted by a plug contact. In such a device, high flow velocities may disadvantageously cause vibrations to be excited in the temperature sensor, in which case the entire conducting wire is set into vibration.

SUMMARY

The present invention provides a device for measuring a pressure and a temperature of a fluid medium flowing in a duct. The device of the present invention includes the following components: a pressure sensor element, a temperature sensor having a temperature sensor element, and a housing. The housing includes a connecting piece, the connecting piece being insertable into the duct in an insertion direction, the connecting piece having an interior chamber, the inner space including an opening, via which the interior chamber may be exposed to the fluid medium. The device further includes a carrier substrate, the pressure sensor element being connected electrically and mechanically to the carrier substrate. In this context, the present invention provides that the carrier substrate be positioned in the interior chamber of the connecting piece in a direction substantially parallel to the insertion direction, the interior chamber extending along the insertion direction. In addition, the present invention provides that the temperature sensor be connected electrically and mechanically to the carrier substrate.

In comparison with the related art, the device of the present invention for measuring a pressure and a temperature of a fluid medium flowing in a duct has the advantage, that the carrier substrate may be mounted with the pressure sensor in the device in a particularly space-saving and simple manner. In addition, the positioning of the carrier substrate in the interior chamber of the connecting piece and the mounting of the temperature sensor to the carrier substrate improves the durability of the temperature sensor considerably, since mounting the temperature sensor to the carrier substrate suppresses or even completely prevents flow-induced excitation of vibrations in the temperature sensor, thereby considerably reducing the risk of a break of the electrical and/or mechanical connection of the temperature sensor to the carrier substrate. Since the carrier substrate is positioned in the interior chamber of the connecting piece, along the insertion direction, the device may be modularly assembled in a particularly advantageous manner. In this manner, different structural variants of the carrier substrate may be inserted into the same connecting piece for different demands on the device. In this manner, considerable engineering and manufacturing costs for different variants of the device may be saved.

Since the housing has a male connector and the carrier substrate is plate-shaped and has a first carrier substrate end opposite to the male connector, in which case the temperature sensor is fixed to the first carrier substrate end, a particularly sturdy and long-lasting connection of the temperature sensor to the device is rendered possible. For by connecting the temperature sensor to the first end of the carrier substrate, it is particularly advantageously ensured that the temperature sensor is connected to the carrier substrate, using an electrical and mechanical connection that is as short as possible. The shorter the connection length of the temperature sensor or, in the case of wired temperature sensors, the shorter the length of the lead wires to the carrier substrate, the higher the self-resonant frequency of the temperature sensor or the self-resonant frequency of the lead wires. The higher the self-resonant frequency, the lower the risk that in the case of high flow velocities, vibrations are excited in the temperature sensor or in the lead wires, which correspond to the self-resonant frequency of the temperature sensor or the lead wires. In this manner, the risk of a mechanical loading of the temperature sensor or the lead wires and a resulting failure of the connection of the temperature sensor or the lead wires to the carrier substrate is advantageously reduced.

One advantageous further refinement of the present invention provides that the temperature sensor element of the temperature sensor be situated at the first end of the carrier substrate and electrically and mechanically connected to the carrier substrate. This advantageously causes the temperature sensor element, which carries out the measurement of temperature as the actual temperature sensor, to be particularly insensitive to flow-induced excitation of vibrations. In addition, such a further refinement of the present invention renders the manufacture of the device particularly cost-effective, since in this connection, the pressure sensor used as the pressure-measuring unit and the temperature sensor acting as the temperature-measuring unit may be integrated on the same carrier substrate, and thus, costly, separate mounting of the temperature sensor in the device or on the carrier substrate may be dispensed with.

Since the carrier substrate has a carrier substrate opening between the pressure sensor element and the temperature sensor element, this advantageously results in the temperature sensor element preferably positioned on the carrier substrate having a particularly short response time to temperature changes, since such a carrier-substrate opening allows, first of all, the fluid medium to flow around the temperature sensor element particularly effectively, and consequently, particularly effective temperature coupling, and secondly, the carrier-substrate opening allows the temperature sensor element to be particularly effectively decoupled from the thermal mass of the carrier substrate. In this manner, particularly responsive, rapid and sensitive temperature measurement is possible, using the temperature sensor element of the temperature sensor.

One further refinement of the device provides that at its end assigned to the fluid medium, the connecting piece include a temperature measuring section, which is contiguous to the interior chamber; the temperature sensor element of the temperature sensor extending through the opening of the interior chamber into the temperature measuring section; in the temperature measuring section, the outer wall of the connecting piece being configured with several wall openings, for example, in the form of slots, in such a manner, that the temperature sensor element of the temperature sensor may be exposed to the flowing fluid medium. This allows the temperature sensor element to react particularly rapidly to temperature changes in the flowing fluid medium, and allows the temperature measurement to be implemented in a particularly sensitive and reliable manner. In this context, it is particularly advantageous that the temperature sensor element is reliably protected by the outer wall of the connecting piece from mechanical effects, such as contact during transport, during handling or during assembly. In this manner, unwanted damage to the temperature sensor element is prevented.

Since, in the interior chamber, the carrier substrate extends, at the most, to the opening of the interior chamber, the carrier substrate is advantageously not exposed directly to the flow of the fluid medium, which means that the risk of damage to the carrier substrate is reduced.

Since, in the interior chamber of the connecting piece, the carrier substrate is fixed to an inner wall of the interior chamber with the aid of a force-locked or a continuous material connection, the carrier substrate is advantageously secured in the interior chamber of the connecting piece in a reliable manner. In addition, such an attachment in the interior chamber of the connecting piece allows the device to be modularly constructed in a particularly simple way, since in this manner, the connecting piece may form, with the carrier substrate, a modular unit that may be combined with further components to form different specific embodiments of the device.

One further refinement of the device provides that the male connector have at least one plug contact, the at least one plug contact being electrically contacted with the carrier substrate at a first end of the plug contact; and the at least one plug contact being able to be electrically contacted with a mating connector at a second end of the plug contact. This further refinement advantageously allows the device to be particularly easily connectible electrically to a control unit or an evaluation unit with the aid of the mating connector. In this manner, the device may be used for a multitude of applications.

A further refinement of the present invention provides that the carrier substrate include a second end of the carrier substrate facing away from the first end of the carrier substrate, the second end of the carrier substrate having at least one connector element for electrical contacting, the at least one connector element being contacted with the first end of the plug contact, using at least one type of connection from the group: snap-in connection, clamping connection, insulation-displacement connection, spring element connection, and adhesive connection. This advantageously allows the carrier substrate to be able to be electrically contacted with the plug contact of the male connector in a particularly simple, cost-effective and reliable manner. For with the aid of these connections, an expensive electrical connection by bonding, welding or soldering, may be dispensed with. In this manner, it is particularly advantageous that thermal loading of the carrier substrate due to a thermal contacting method may be eliminated.

A further refinement of the present invention provides that the pressure sensor element and/or the temperature sensor be covered by a passivating layer, in particular, a gel. In this manner, the pressure sensor element and/or the temperature sensor are advantageously protected permanently from impairment or damage resulting from moisture and/or particles, which are situated in the fluid medium. It is particularly advantageous that the passivating layer protects the pressure sensor element and/or the temperature sensor from corrosion attacks resulting from contact with hydrochloric acid, sulfuric acid or nitric acid contained in the fluid medium.

BRIEF DESCRIPTION OF THE DRAWINGS

FIG. 1b a cross-section of a first exemplary embodiment of a first specific embodiment of a device according to the present invention, having the carrier substrate from FIG. 1a.

FIG. 2b a cross-section of a first exemplary embodiment of a second specific embodiment of a device according to the present invention, having the carrier substrate from FIG. 2a.

DETAILED DESCRIPTION

Figure 1A:
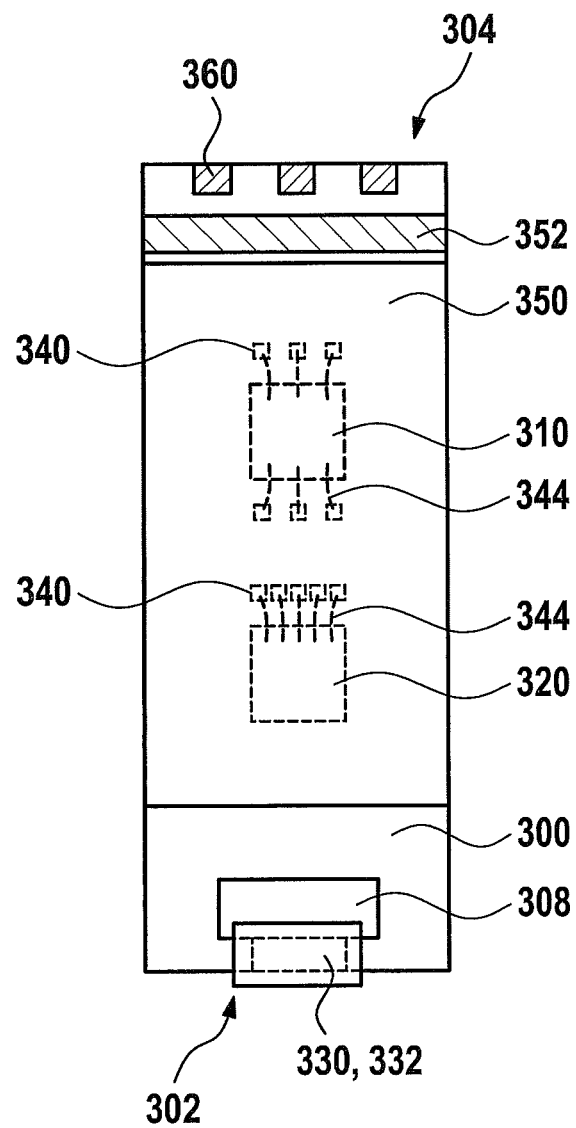
FIG. 1a a top view through a first specific embodiment of a carrier substrate, which may be used in the device of the present invention.
Figure 1B:
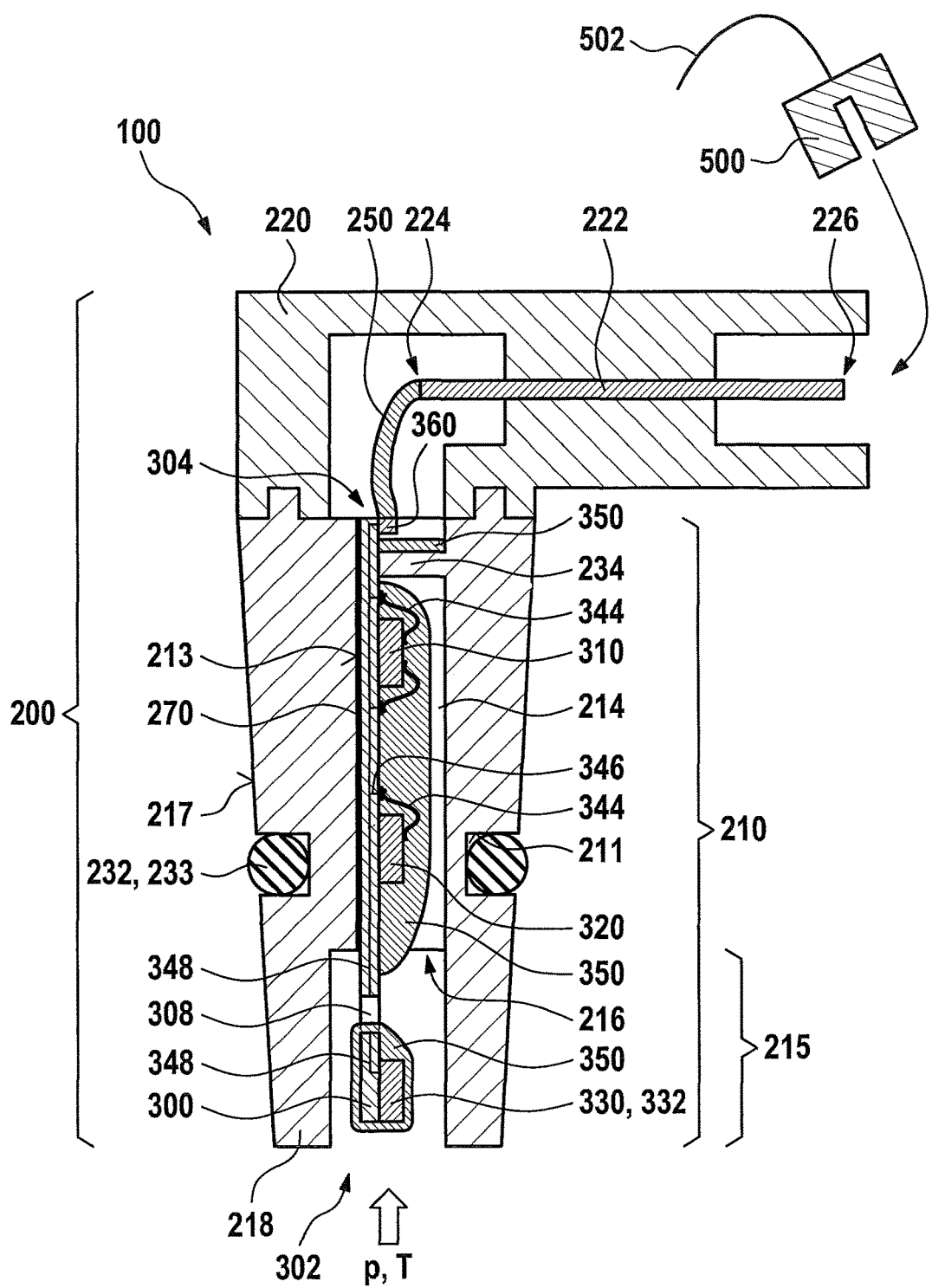

FIG. 1a shows a carrier substrate 300 for attachment in an interior chamber 214 of a connecting piece 210 of a first exemplary embodiment of a first specific embodiment of a device 100 for measuring a pressure (p) and a temperature (T) of a fluid medium flowing in a duct, illustrated in FIG. 1b. Carrier substrate 300 preferably takes the form of a printed circuit board (PCB), a flexible circuit board or a ceramic. It is particularly preferred that a carrier substrate 300 taking the form of a circuit board be made of a circuit board material FR4 or better.

An integrated circuit 310, for example, an application-specific integrated circuit (ASIC), is positioned on carrier substrate 300. Integrated circuit 310 is electrically contacted with contacting elements 340, e.g., bonding pads, of carrier substrate 300, with the aid of electrical connecting elements 344, e.g., with the aid of bonding wires. Additionally situated on carrier substrate 300 is a pressure sensor element 320, which is also electrically contacted with contacting elements 340 of the carrier substrate via electrical connecting elements 344. Integrated circuit 310 and pressure sensor element 320 may be mechanically connected to carrier substrate 300 via, for example, an adhesive bond. Flip-chip assembly of integrated circuit 310 and/or of pressure sensor element 320 is also possible.

In a specific embodiment not illustrated here, integrated electronic circuit 310 is embedded in the carrier substrate 300 taking the form of a printed circuit board (PCB). In this manner, carrier substrate 300 may be manufactured in a particularly compact and space-saving way. Furthermore, such an embedded, integrated electronic circuit, in particular, an ASIC, is protected particularly effectively from adverse mechanical and chemical (corrosive) influences, thereby increasing the reliability and durability.

Carrier substrate 300 also has a first end of the carrier substrate 302, which is assigned, in the mounted state in device 100, to the fluid medium. In the exemplary embodiment illustrated, a temperature sensor 330 having a temperature sensor element 332 is situated at this first end of carrier substrate 302. Temperature sensor 330, 332 is preferably a non-wired, standard temperature sensor (e.g., an SMD-NTC or a temperature diode). In carrier substrate 300, a carrier substrate opening 308 is provided between temperature sensor 330 and pressure sensor element 320. Temperature sensor 330 is thermally decoupled from carrier substrate 300 by this carrier substrate opening 308. In this manner, an effect of the thermal mass of carrier substrate 300 on temperature sensor 330 and temperature sensor element 332 is considerably reduced, and the response time of temperature sensor 330 to temperature changes is markedly reduced. In addition, carrier substrate opening 308 ensures that the fluid medium flows around temperature sensor 330 effectively. Furthermore, obstruction of the flow of the fluid medium by the carrier substrate 300 situated in the flow is kept as low as possible by carrier substrate opening 308. Carrier substrate 300 is preferably plate-shaped, and at its second carrier substrate end 304 facing away from first end of the carrier substrate 302, it has connector elements 360, by which carrier substrate 300 may be contacted electrically. Electrical conductor tracks 348, which are illustrated in FIG. 1b, run in the interior of carrier substrate 300 or on its upper surface. The electric conductor tracks 348 running in the interior of carrier substrate 300 are electrically connected to contacting elements 340 and to connector elements 360 of carrier substrate 300, using vias 346. It is particularly preferable for integrated circuit 310 and/or pressure sensor element 320 and/or the temperature sensor 330 having temperature sensor element 332 to be covered by a passivating layer 350. In this context, passivating layer 350 takes the form of a gel layer, for example. With the aid of passivating layer 350, the components covered by it are effectively protected from moisture, mechanical stresses caused by icing, aggressive media in the fluid medium, and from particle deposits.

On its upper surface, carrier substrate 300 also has a sealing-tongue region 352, which, in the mounted state, is in contact with a sealing tongue 234 of a connecting piece 210 illustrated in FIG. 1b, as explained in detail below.

FIG. 1b shows a cross-section of a first exemplary embodiment of the device 100 according to the present invention. Device 100 includes a housing 200 having a connecting piece 210 and a male connector 220. Connecting piece 210 forms an interior chamber 214 in its interior, interior chamber 214 being delimited by an interior chamber wall 213. In addition, connecting piece 210 has a preferably circumferential groove 211 on its outer wall 217; a sealing device 232, preferably an O-ring 233, being able to be fixed in position in the groove.

Connecting piece 210 is insertable, in an insertion direction, into a duct in which the fluid medium flows, in such a manner, that sealing device 232 effectively prevents the fluid medium from flowing out of the duct between outer wall 217 of the connecting piece and an insertion opening of the duct not illustrated here.

Interior chamber 214 of connecting piece 210 has an opening 216, via which interior chamber 214 may be exposed to the fluid medium. In this manner, pressure (p) of the fluid medium is applied in interior chamber 214. In addition, at its end assigned to the fluid medium, connecting piece 210 has a temperature measuring section 215, which is contiguous to interior chamber 214. Outer wall 217 of connecting piece 210 has a plurality of wall openings 219 in temperature measuring section 215 (illustrated in FIG. 1c), wall openings 219 being in the form of slots, for example. Due to the wall openings 219 introduced into outer wall 217 of connecting piece 210 in temperature measuring section 215, outer wall 217 preferably forms a rib structure 218. However, a lattice structure may also be formed. The outer wall 217 formed in temperature measuring section 215 in this manner constitutes a type of protective cage for temperature sensor element 332 and the carrier substrate 300 projecting into temperature measuring section 215. Owing to this protective cage, temperature sensor element 332 is, on one hand, protected from unwanted contact, e.g., during transport, during (external) packaging, or during assembly, and secondly, the insertion of the device into the duct is made easier during mounting. In addition, the flowing fluid medium may flow directly against temperature sensor element 332.

In interior chamber 214 of connecting piece 210, carrier substrate 300 is preferably fixed in position on inner wall 213 of interior chamber 214, using an adhesive bond or clip connection. In the exemplary embodiment illustrated, carrier substrate 300 is cemented to inner wall 213 of interior chamber 214 by an adhesive layer 217 in such a manner, that in temperature measuring section 215, the fluid medium may flow around the temperature sensor element 332 situated at first end of carrier substrate 302.

A male connector 220 of housing 200 is situated at the end of connecting piece 210 facing away from the fluid medium. Male connector 220 has at least one plug contact 222, the at least one plug contact 222 being electrically contacted with carrier substrate 300 at a first end of the plug contact 224; and the at least one plug contact 242 being able to be electrically contacted with a mating connector 500 at a second end of the plug contact 226. Mating connector 500 belongs, for example, to a control unit and is electrically connected to it by an electrical lead 502. In FIG. 1b, how mating connector 500 is put onto male connector 220 and contactable with second contact end 226 is indicated by an arrow.

In the exemplary embodiment illustrated, first plug contact end 224 takes the form of a contact spring element 250, which, in the assembled state, is pressed against corresponding connector element 360 of carrier substrate 300. Permanent mechanical and electrical contact between contact spring element 250 and connector elements 360 of carrier substrate 300 is ensured by the spring force of contact spring element 250.

It is particularly preferable for plate-shaped carrier substrate 300 to be positioned substantially perpendicular to first plug contact end 224 of the at least one plug contact 222. This allows particularly effective contacting to be achieved between plug contact 222 and connector elements 360 of the carrier substrate, for example, by contact spring element 250.

Together with sealing tongue region 352 of carrier substrate 300 and a passivating layer 350 applied to the side of sealing tongue 234 facing way from the fluid medium, the sealing tongue 234 situated on connecting piece 210 reliably ensures that no fluid medium situated in interior chamber 214 can reach connector elements 360 of carrier substrate 300.

Figure 1C:
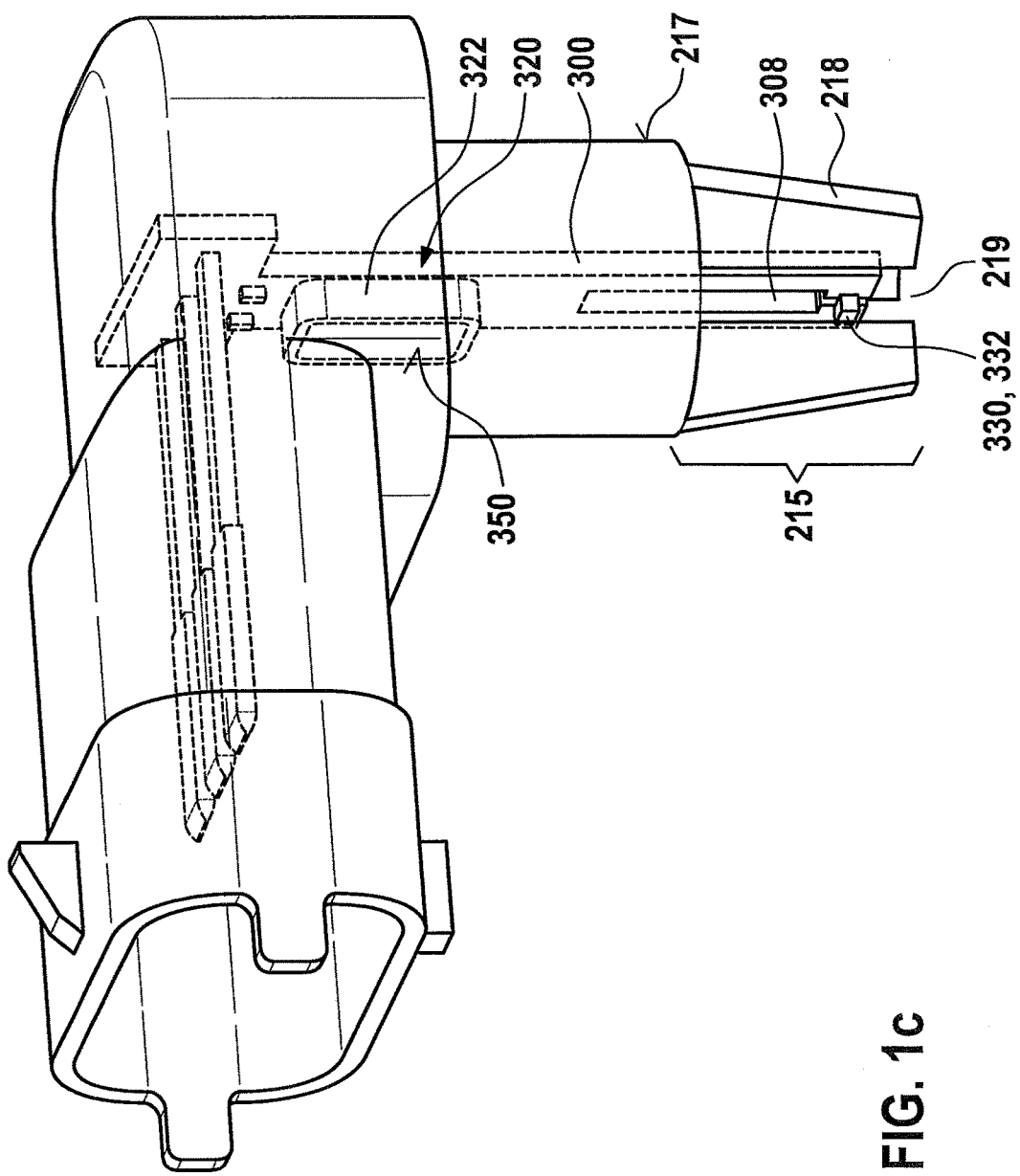
FIG. 1c a perspective view of a second exemplary embodiment of the first specific embodiment.

FIG. 1c shows a further exemplary embodiment of the first specific embodiment of the present invention. In the exemplary embodiment shown, carrier substrate 300 is inserted far into temperature measuring section 215. Temperature sensor element 332 of temperature sensor 330 is mechanically and electrically attached to first carrier substrate end 302 of carrier substrate 300. Carrier substrate opening 308 extends from temperature measuring section 215, through opening 216, into interior chamber 214. In temperature measuring section 215, the design of outer wall 217 of connecting piece 210 is represented as a ribbed structure 218, the ribs being separated from one another by slot-shaped wall openings 219.

The pressure sensor element 320 situated on carrier substrate 300 is surrounded by a small ring-like frame 322, which is filled with a gel acting as a passivating layer 350. In so doing, the gel covers pressure sensor element 320 completely.

Figure 2A:
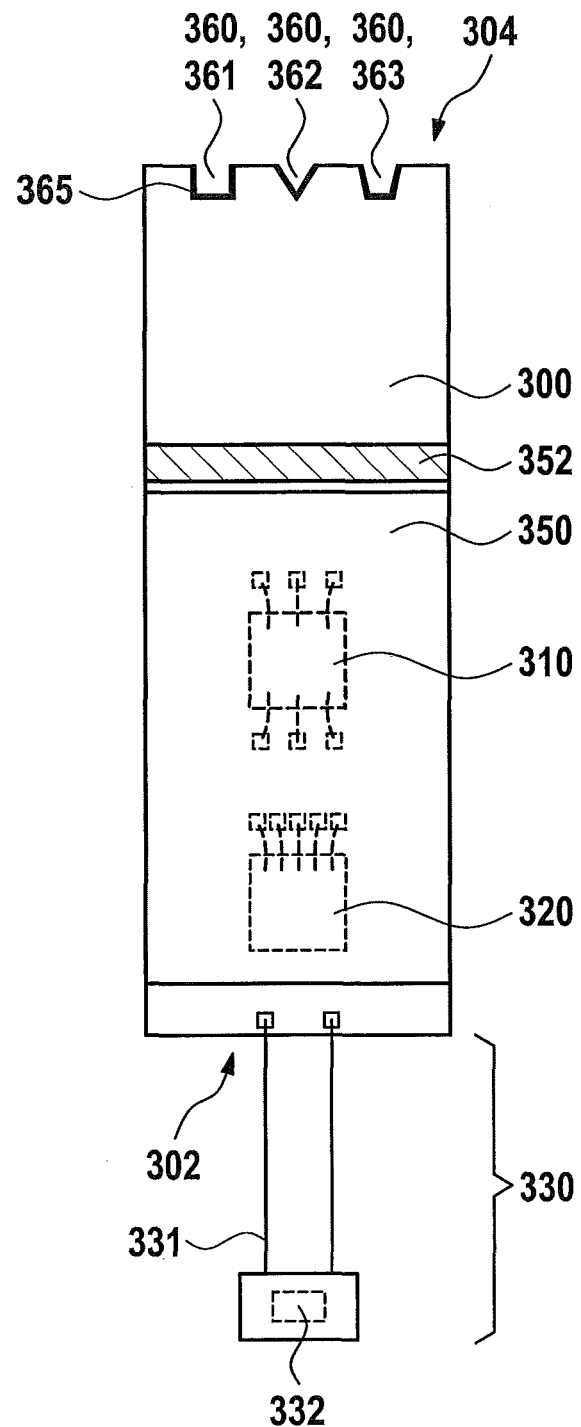
FIG. 2a a top view through a second specific embodiment of a carrier substrate, which may be used in the device of the present invention.
Figure 2B:
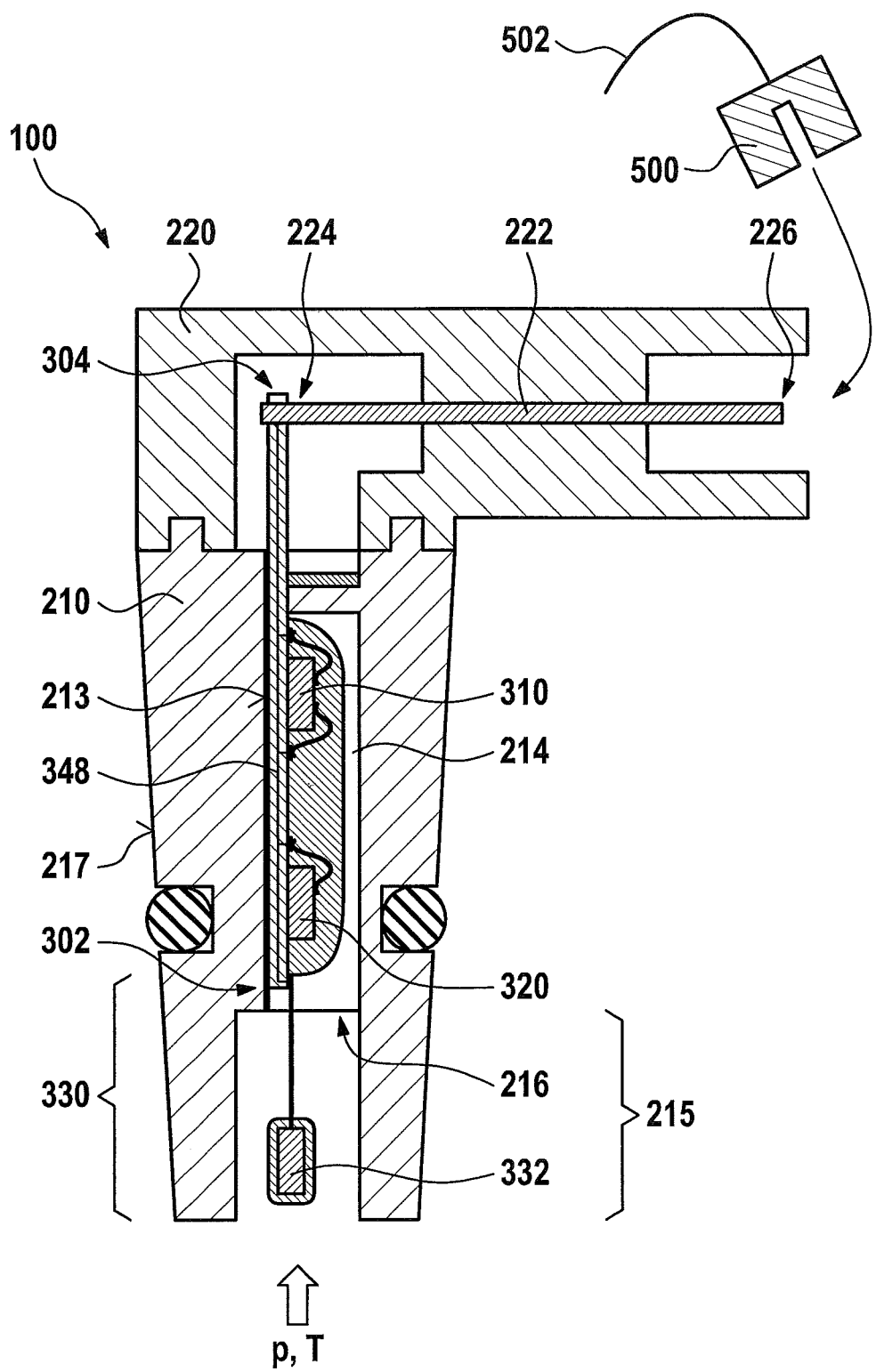

FIG. 2a shows a carrier substrate 300, which is mounted in a first exemplary embodiment of a second specific embodiment of the present invention, represented in FIG. 2b. Carrier substrate 300 includes an integrated electronic circuit 310 and a pressure sensor element 320. In the specific embodiment represented, temperature sensor 330 is configured as a wired temperature sensor 330. In this context, temperature sensor 330 includes electrical lead wires 331 and a temperature sensor element 332 connected to lead wires 331. Temperature sensor 330 is electrically and mechanically connected to first carrier substrate end 302 by the side of the lead wires 331 facing away from temperature sensor element 332. Due to the connection of temperature sensor element 332 to carrier substrate 300 via lead wires 331, temperature sensor element 332 is thermally decoupled from carrier substrate 300 in a particularly effective manner. In order to suppress excitation of vibrations of temperature sensor 300 as a result of fluid medium flowing along temperature sensor 330, temperature sensor element 332 of temperature sensor 330 is preferably set apart from first carrier substrate end 302 of the carrier substrate by not more than 1 cm.

At its second carrier substrate end 304, carrier substrate 300 has connector element 360, which are suitable for a snap-in connection and/or clamping connection and/or insulation-displacement connection. To that end, connector elements 360 are formed as notches, which may have, for example, a U-shaped or rectangular profile 361 or a V-shaped profile 362 or a trapezoidal profile 363 as a function of the shape of the first plug contact ends 224 coming to rest in them. In the exemplary embodiment illustrated, different profiles of connector elements 360 are shown on the same carrier substrate 300. The notches acting as connector elements 360 are provided for optimized electrical contact with a metallic layer 365. It is particularly preferable for metallic layer 365 to be made of copper, silver or gold.

FIG. 2b shows the first exemplary embodiment of the second specific embodiment of device 100. Carrier substrate 300 is mounted in interior chamber 214 of connecting piece 210. First carrier substrate end 302 lies completely in interior chamber 214 and does not protrude through opening 216 of interior chamber 214. In this manner, pressure sensor element 320 is protected from contaminants transported by the flowing medium. Temperature sensor 330 protrudes from first carrier substrate end 302 through opening 216 of interior chamber 214 into temperature measuring section 215 in such a manner, that fluid medium may flow around temperature sensor element 332.

Second carrier substrate end 304 of carrier substrate 300 protrudes into male connector 220. In male connector 220, connection ends 360 of carrier substrate 300 are mechanically and electrically contacted, in each instance, with a first plug contact end 224 of a plug contact 222, for example, by forcing them in. At their second plug contact end 226, plug contacts 222 may be electrically contacted with a mating connector that may be put onto male connector 220.

In FIG. 2b, mating connector 500 is illustrated with its connection lead 502. Mating connector 500 is suitable for being plugged onto second plug contact end 226 and electrically contacting it.

Figure 2C:
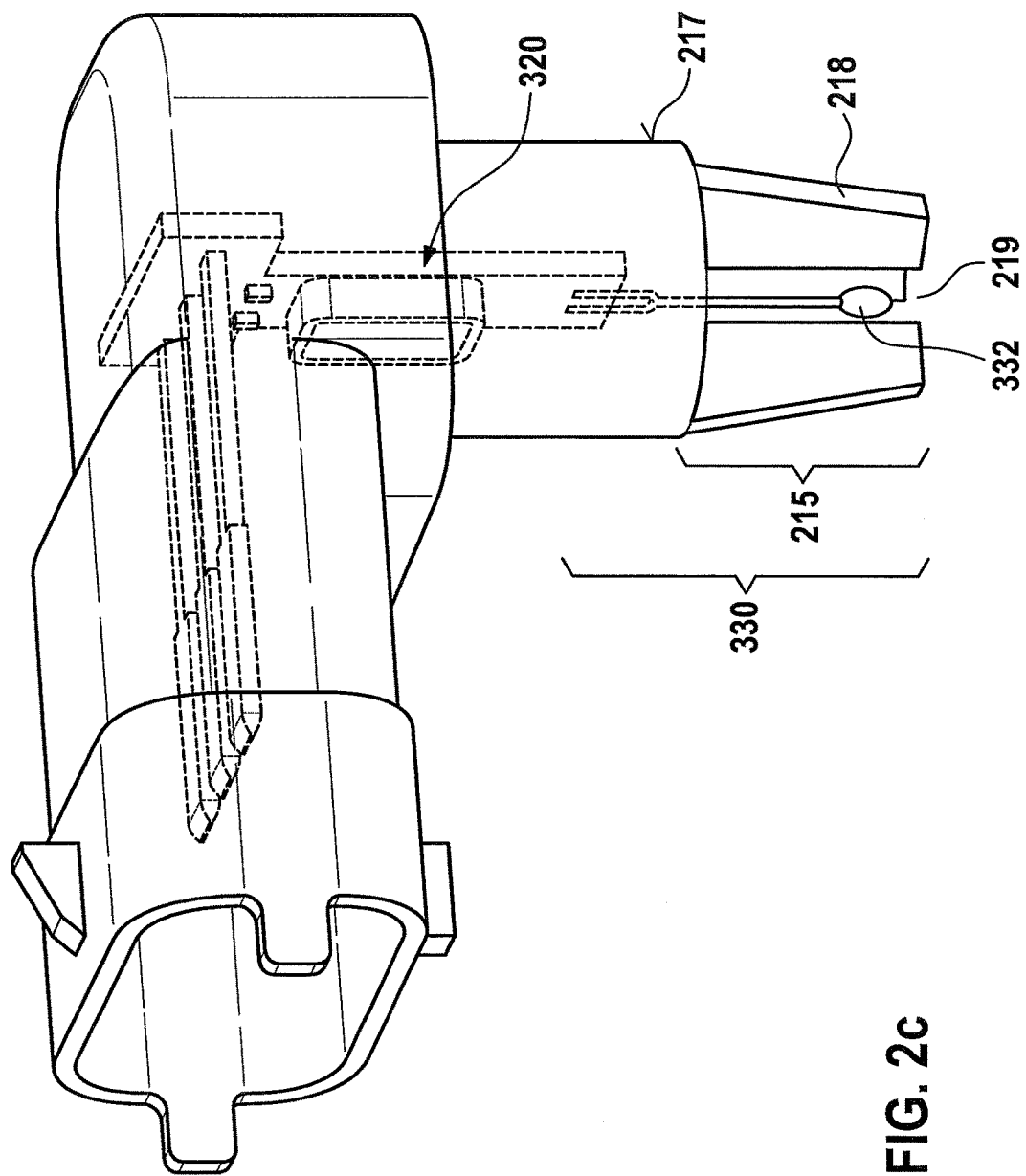
FIG. 2c a perspective view of a second exemplary embodiment of the second specific embodiment.

FIG. 2c shows a second exemplary embodiment of the second specific embodiment of the present invention. In this exemplary embodiment, only a pressure sensor element 320 is situated on carrier substrate 300. Pressure sensor element 320 is surrounded by a small annular frame 322, which is filled with a gel acting as a passivating layer 350, in such a manner, that pressure sensor element 320 is completely covered.

The design of device 100 according to the present invention allows housing 200 to be assembled in a modular manner and be divided according to function: into a mechanical region and into a sensory region. In this context, second carrier substrate end 304 is situated in the mechanical region, in which the electrical contacting between plug contacts 222 and connector elements 360 is implemented. Interior chamber 214 and temperature measuring section 215 form the sensory region. The mechanical region and the sensory region are sealed off from one another and separated from one another by sealing tongue 234 and sealing tongue region 352 of carrier substrate 300. In the case of wired temperature sensors 330, the present invention allows lead wires 331 to be shortened considerably in comparison with the related art, which produces a marked increase in the resonant frequency of lead wires 331. In a device 100 corresponding to the first specific embodiment of the present invention (FIGS. 1a through 1c), a wired temperature sensor 330 is even completely eliminated. The present invention allows connecting piece 210 to be manufactured as a standard component, into the interior chamber 214 of which pressure is supplied. The geometric and structural design of carrier substrate 300 is adapted to the dimensions of the connecting piece 210 manufactured as a standard component, as a function of the purpose of the application, which allows production costs to be reduced considerably. Male connector 220 may be connected to connecting piece 210 to form a uniform and sealed housing 200 by gluing, welding (for example, laser welding and/or ultrasonic welding), or by a force-locked or by a form-locked connection.

The present invention is particularly preferably suited for measuring a pressure (p) and a temperature (T) in the suction pipe of an internal combustion engine or in the exhaust tract of an internal combustion engine. Use in flow channels of air conditioners or turbines is also conceivable.

What is claimed is:

1. A device for measuring a pressure and a temperature of a fluid medium flowing in a duct, comprising:
   a pressure sensor element;
   a temperature sensor including a temperature sensor element;
   a housing including a connecting piece that is insertable into the duct in an insertion direction, wherein:
      the connecting piece includes an interior chamber, and
      the interior chamber includes an opening through which the interior chamber may be exposed to the fluid medium; and
   a carrier substrate, wherein:
      the pressure sensor element is connected electrically and mechanically to the carrier substrate, the carrier substrate is positioned substantially parallel to the insertion direction, in the interior chamber of the connecting piece, the interior chamber extends along the insertion direction, and the temperature sensor is connected electrically and mechanically to the carrier substrate.

2. The device as recited in claim 1, wherein:

at an end of the connecting piece assigned to the fluid medium, the connecting piece includes a temperature measuring section that is contiguous to the interior chamber, the temperature sensor element of the temperature sensor extends through the opening of the interior chamber into the temperature measuring section, in the temperature measuring section, an outer wall on the connecting piece is configured with a plurality of wall openings in such a manner that the temperature sensor element of the temperature sensor may be exposed to the flowing fluid medium.

3. The device as recited in claim 1, wherein the plurality of wall openings are each in the shape of a slot.

4. The device as recited in claim 1, wherein in the interior chamber, the carrier substrate extends, at most, to the opening of the interior chamber.

5. The device as recited in claim 1, wherein in the interior chamber of the connecting piece, the carrier substrate is fixed to an inner wall of the interior chamber with the aid of one of a force-locked and a continuous material connection.

6. The device as recited in claim 1, wherein at least one of the pressure sensor element and the temperature sensor is covered by a passivating layer.

7. The device as recited in claim 6, wherein the passivating layer includes a gel.

8. The device as recited in claim 1, wherein:

the housing includes a male connector, and the carrier substrate is plate-shaped and has a first carrier substrate end opposite to the male connector, and the temperature sensor is attached to the first carrier substrate end.

9. The device as recited in claim 8, wherein the temperature sensor element of the temperature sensor is positioned at the first carrier substrate end and is connected to the carrier substrate electrically and mechanically.

10. The device as recited in claim 3, wherein the carrier substrate includes a carrier substrate opening between the pressure sensor element and the temperature sensor element.

11. The device as recited in claim 8, wherein:

the male connector includes at least one plug contact, the at least one plug contact is electrically contacted to the carrier substrate at a first end of the plug contact; and the at least one plug contact is able to be electrically contacted with a mating connector at a second end of the plug contact.

12. The device as recited in claim 11, wherein:

the carrier substrate includes a second carrier substrate end that faces away from the first carrier substrate end and has at least one connector element for electrical contacting, and the at least one connector element is contacted with the first end of the plug contact, using at least one type of connection from the group: snap-in connection, clamping connection, insulation-displacement connection, spring element connection, and adhesive connection.

* * * * *